United States Patent
Höfer

(10) Patent No.: US 6,600,433 B1
(45) Date of Patent: Jul. 29, 2003

(54) METHOD AND APPARATUS FOR CORRECTING DIGITAL CODE WORDS IN A DIGITAL COMMUNICATION NETWORK

(75) Inventor: Gerald Höfer, Langerringen (DE)

(73) Assignee: Infineon Technologies, AG, Munich (DE)

( * ) Notice: Subject to any disclaimer, the term of this patent is extended or adjusted under 35 U.S.C. 154(b) by 0 days.

(21) Appl. No.: 10/009,156

(22) PCT Filed: May 12, 2000

(86) PCT No.: PCT/DE00/01506

§ 371 (c)(1),
(2), (4) Date: Mar. 12, 2002

(87) PCT Pub. No.: WO00/69135

PCT Pub. Date: Nov. 16, 2000

(30) Foreign Application Priority Data

May 12, 1999 (DE) .......................... 199 22 172

(51) Int. Cl.[7] .............................................. H03M 13/00
(52) U.S. Cl. .................... 341/94; 370/522; 370/523; 375/222
(58) Field of Search ............................ 341/94; 370/522, 370/523; 375/222, 242–254

(56) References Cited

U.S. PATENT DOCUMENTS

| | | | |
|---|---|---|---|
| 5,754,594 A | * 5/1998 | Betts et al. | 375/285 |
| 5,784,405 A | * 7/1998 | Betts et al. | 375/222 |
| 5,812,075 A | * 9/1998 | Betts et al. | 341/94 |
| 5,825,823 A | 10/1998 | Goldstein et al. | |
| 5,875,229 A | * 2/1999 | Eyuboglu et al. | 379/1.04 |
| 5,995,558 A | * 11/1999 | Betts et al. | 375/316 |
| 6,118,813 A | * 9/2000 | Lai | 375/231 |
| 6,480,549 B1 | * 11/2002 | Hirzel et al. | 375/242 |

FOREIGN PATENT DOCUMENTS

| | | |
|---|---|---|
| WO | WO 99/21288 | 4/1999 |
| WO | WO 99/65156 | 12/1999 |

* cited by examiner

Primary Examiner—Michael Tokar
Assistant Examiner—Khai Nguyen
(74) Attorney, Agent, or Firm—Jenkins, Wilson and Taylor, P.A.

(57) ABSTRACT

Digital code words are transmitted via a digital communication network, e.g. from a digital modem (1) to an analog modem (5). Whenever an RBS technique is used for an RBS channel, a given bit, as a rule the LSB, of a corresponding code word is changed. In order to recognize and correct such RBS channels, training code words transmitted during a training phase are evaluated. If an RBS channel is detected, the given bit of the corresponding code word is set to a fixed value.

14 Claims, 3 Drawing Sheets

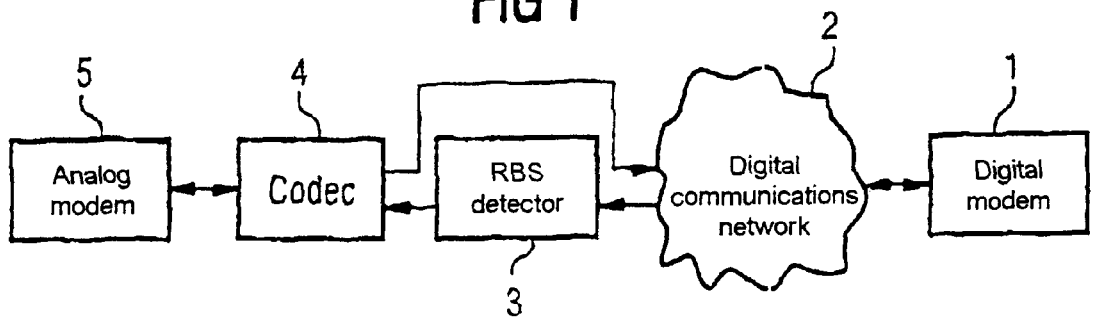
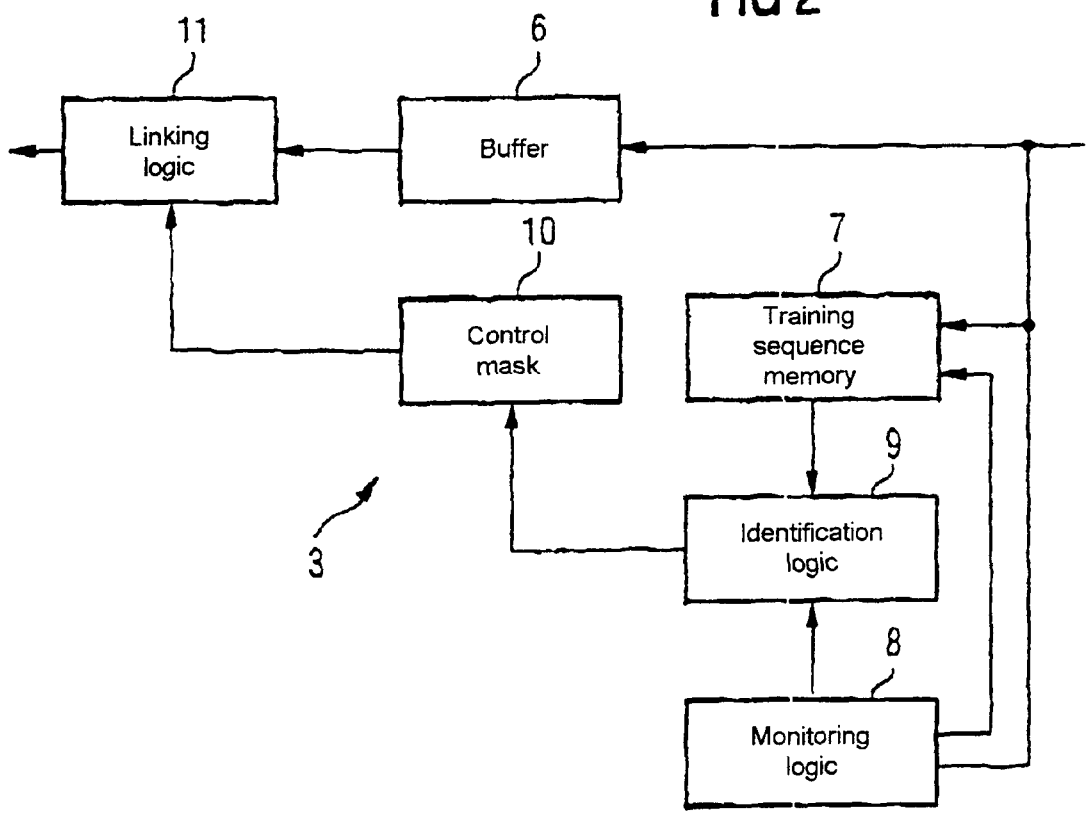

FIG 3
FIG 4A
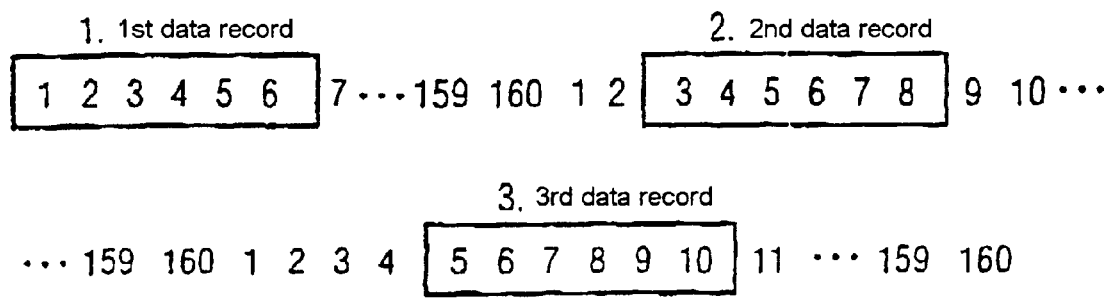
FIG 4B
| Position in the data record | No. 1 | No. 2 | No. 3 | No. 4 | No. 5 | No. 6 |
|---|---|---|---|---|---|---|
| 1. 1st data record | 1 | 2 | 3 | 4 | ⑤ | ⑥ |
| 2. 2nd data record | 3 | 4 | ⑤ | ⑥ | 7 | 8 |
| 3. 3rd data record | ⑤ | ⑥ | 7 | 8 | 9 | 10 |

METHOD AND APPARATUS FOR CORRECTING DIGITAL CODE WORDS IN A DIGITAL COMMUNICATION NETWORK

TECHNICAL FIELD

The present invention relates to a method and an apparatus for correcting digital code words in a digital communications network, in particular in a communications network in which what is referred to as RBS signaling is carried out.

As is shown in FIG. 6, communications networks 2, in particular such as telephone networks, are frequently used as interfaces for transmitting communication information between a digital modem 1 and an analog modem 5, or what is referred to as a linecard. The digital communications network 2 may in general, for example, be in the form of an integrated services digital network (ISDN), an optical waveguide network, a coaxial cable network, a satellite network, or else may be configured without the use of wires. The communication via the digital communications network 2 generally makes use of pulse code modulation (PCM). The digital communications network 2 is connected via a coder/decoder 4 (Codec) to the analog modem 5, with the Codec 4 being used as the interface between the digital communications network 2 and the analog modem 5. In order to transmit communication information from the digital communications network 2 to the analog modem 5, the Codec 4 has, inter alia, a digital/analog converter for converting nonlinear signal levels, for example $\mu$-coded or A-coded signal levels, to a linear analog signal, and, for transmitting communication information from the analog modem 5 to the digital communications network 2, it has, inter alia, an analog/digital converter for converting a linear analog signal to non-linear $\mu$-coded or A-coded code words.

An in-band signaling technique referred to as RBS (Rob Bit Signaling) is frequently used in digital networks. The RBS technique is a signaling method that is used especially in North American telephone networks, with the least significant bit (LSB) of a digital PCM code word that is to be transmitted via the telephone network being changed at specific intervals, and being used for signaling purposes. For example, the LSB in every 6th to 24th frame is thus set either to the logic value "0", or to the logic value "1".

For transmissions based on the latest V.90 Standard modem, the transmitted PCM values must be reproduced as accurately as possible. However, RBS channels corrupt the PCM values, thus making correct identification in the modem harder. It is thus necessary to set the bits which are changed when using the RBS technique to a constant value before such data is received by the Codec 4 shown in FIG. 6. However, in practice, this is frequently not the case.

Furthermore, the use of the RBS technique is associated with further problems. Particularly when using the V.90 standard for transmitting PCM modem data, adaptation to transmission paths which continue onward in the LSB signaling information is difficult. The RBS technique increases the error rate. The maximum possible error when using the digital modem 1 to code a given signal level is 0.5*LSB. The LSB is forcibly set either to 0 or 1 in an RBS frame or an RBS channel. The maximum error caused by the coding process is thus increased to three times this value, that is to say to 1.5*LSB. The performance of the modem is thus necessarily worse when using the RBS technique.

There is thus a need to improve the data transmission in digital communications networks in which the RBS technique is used.

For this reason, Codec modules 4 are known to which the information about when an RBS channel or an RBS connection is present is supplied via an external trigger signal, in response to which the PCM characteristic for decoding the received digital code words is appropriately changed and adapted. Thus, for example, the error produced by the RBS technique can be reduced by ignoring the LSB for RBS frames and, instead of this, by setting the analog output value to half the two adjacent PCM values. However, this procedure has the disadvantage that, firstly, an additional control signal must be provided by means of appropriate hardware and, secondly, only local RBS channels can be coped with. However, it is possible for a situation to occur in which a number of line sections in a transmission path use the RBS technique, with these line sections not being synchronized and influencing various digital PCM values to be transmitted.

RBS compensation systems for compensating for the disturbances associated with the use of the RBS technique have been proposed in U.S. Pat. No. 5,754,594, U.S. Pat. No. 5,784,405 and U.S. Pat. No. 5,812,075, in which case, according to these documents, the corresponding RBS compensation system is in each case told which frames or PCM values in the digital data to be transmitted have RBS applied to them by means of the digital communications network via which they are transmitted. These solutions thus presupposed that the position and the occurrence of the RBS channels or RBS values are known although, frequently, this is not true. Furthermore, the systems described in these documents are used exclusively to minimize the faults in an analog signal caused by RBS channels. However, they are not able to satisfy the requirements, which have already been mentioned above, associated with the latest V.90 Standard/modem.

The present invention is thus based on the object of providing a capability for reproducing received code words or PCM values as accurately and reliably as possible even when they have been corrupted by the RBS technique, with this being intended to be possible, in particular, even when the position of the RBS channels is not known.

According to the present invention, this object is achieved by a method having the features of claim 1, and by an apparatus having the features of claim 12. The dependent claims define advantageous and preferred exemplary embodiments of the present invention.

According to the invention, training code words transmitted during a training phase are evaluated, and the presence of an RBS channel is deduced as a function of the result of the evaluation of the training code words. The position of each RBS channel and/or the nature of the RBS channel, that is to say the nature of the RBS technique, can then be stored, so that the knowledge obtained during the training phase is also available during normal operation for correction of the RBS channels or of the corresponding code words.

When an RBS channel is identified, the code words transmitted via this channel are corrected such that that bit in this code word which is changed by the RBS technique is always set to a fixed value and is output (to a downstream Codec), so that the initially mentioned requirements can be satisfied after setting the changed bits to a constant value, before they are supplied to the Codec. The present invention thus makes it possible to achieve an improved transmission rate using the analog modem.

According to a first exemplary embodiment, the code words in identified RBS channels are corrected such that they are preferably supplied to the Codec with the fixed value "1".

A second exemplary embodiment makes use of the fact that the training code words are transmitted repeatedly during the training phase, so that RBS channels can be detected by comparing the training code words transmitted during the various repetitions and corresponding training code words.

The code words associated with RBS channels can also be replaced by their original values, and can be supplied to the Codec such that the influences of the RBS technique are eliminated. This thus reliably prevents corruption of the training signal by the RBS technique which, for example in the case of the V.90 Standard, could lead to an incorrect decision on the V.90 capability of the receiving modem.

The invention will be explained in more detail in the following text with reference to preferred exemplary embodiments and using the attached drawing, in which:

BRIEF DESCRIPTION OF THE DRAWINGS

FIG. 1 shows, in general form, the design of a communications system in which the present invention is used, FIG. 2 shows a block diagram of a first exemplary embodiment of an apparatus according to the invention, FIG. 3 shows the formation of a training signal which can be evaluated using the method according to the invention and is transmitted via the communications network shown in FIG. 1, during a training phase, FIGS. 4A and 4B show illustrations to explain the method of operation of a second exemplary embodiment of the present invention.

FIG. 1 shows the basic structure of a communications system in which the present invention is used. In a corresponding way to that shown in FIG. 6, the communications system comprises a digital modem 1, which communicates with an analog modem 5 via a digital communications network 2. A coder/decoder or Codec 4 is provided as the interface between the analog modem 5 and the digital communications network 2. The Codec 4 uses its digital interface to access the digital and PCM-coded data transmitted via the digital communications network 2, and can thus accurately detect even very small amplitude differences. At this point, reference should be made to the description relating to FIG. 6 for further details relating to these components.

Figure 6:
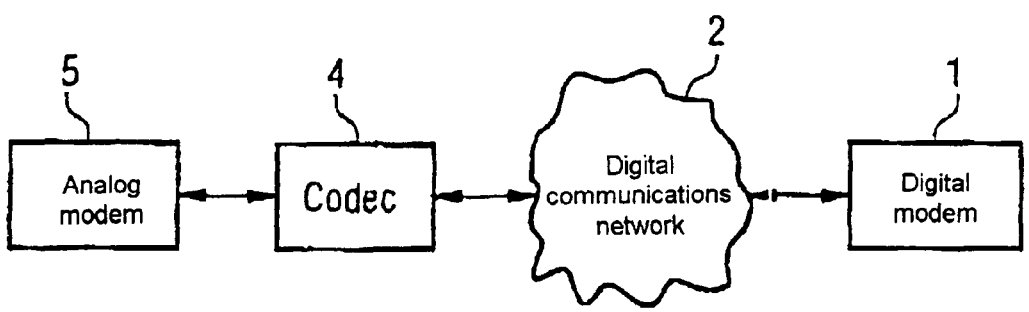
FIG. 6 shows the design of a conventional communications system according to the prior art.

In addition to the components already known from FIG. 6, an RBS detector 3 is provided, and is connected in the signal path from the digital communications network 2 to the Codec 4. The object of this RBS detector 3 is to identify, from the PCM code words supplied to the Codec 4 and to the analog modem 5, those PCM code words which have been corrupted or changed by use of the RBS technique described initially, and to correct these values in accordance with a specific scheme. As will be explained in more detail in the following text, the RBS detector 3 uses a training signal for this purpose which, in the communications system illustrated in FIG. 1, for example, is transmitted in order to test the available PCM codes. After identification of an RBS channel or RBS frame with PCM values corrupted by use of the RBS technique in the digital communications network 2 for signaling purposes, these values can be processed or corrected by the RBS detector 3 such that the changed bits set to a constant value or else the original PCM values are reliably supplied to the Codec 4.

A training or line probing signal described above has already been provided, according to the V.34 Standard, in order to determine the frequency response of the communications system and to test the available PCM codes. For this purpose, the training signal is transmitted by one modem during a training phase, and is received and evaluated by the other modem, communicating with it. In accordance with the V.34 Standard, the training signal comprises twenty repeated digital values, which each represent analog sum values of sinusoidal signals at specific frequencies. This training signal is also provided in the V.90 standard, and is used to identify V.90-compatible connections.

However, no fixed test patterns have been predetermined for producing the test signal described above, and only the method for parameter transmission is defined. The test signal comprises firstly training symbols and secondly rest symbols, with the sequence between the training symbols and rest symbols and the sequence of the individual mathematical signs being defined.

FIG. 2 shows the design of a first exemplary embodiment of the RBS detector 3 according to the present invention shown in FIG. 1. According to this first exemplary embodiment, the RBS detector 3 is designed in particular not only to identify RBS channels or RBS values, but is also used to ensure that, when using the RBS technique, the respectively changed bits are reliably set to a constant value, in accordance with the recommendations in the Standard, before the Codec 4 receives the data.

As is shown in FIG. 2, the first exemplary embodiment of the RBS detector 3 comprises a buffer 6, which applies a time delay to the PCM data arriving from the switching center, exchange or digital communications network 2.

Furthermore, a training signal memory or training sequence memory 7 is provided, in which the training signal is buffer stored with the repeated sequence of training and rest symbols.

The training sequence memory 7 is preferably activated by monitoring logic 8, which monitors the connection state and the received PCM data for the occurrence of the already described training phase. The monitoring logic 8 identifies the start of the training phase in particular by the occurrence of a PCM value which identifies the start of the training phase. After identification of the training phase, the monitoring logic 8 activates not only the training sequence memory 7 but also identification logic 9.

The identification logic 9 comprises a frame counter, which preferably in each case counts down six successive frames or PCM values. The counting process starts with the frame No. 0 when the training phase is identified. Furthermore, after identifying the training phase, the training logic 9 firstly stores the training symbol and the rest symbol, and then determines their length. In parallel with this, the identification logic 9 checks whether the LSB has been changed in specific frames stored in the training memory 7. To do this, the identification logic checks whether the received LSB actually has or does not have the same value in the respectively transmitted known PCM value with the LSB value 0 or 1. Depending on the result of this evaluation, the identification logic 9 stores information for each frame or channel as to whether this is an RBS frame or an RBS channel. The identification logic 9 thus contains stored information as to whether each frame position is an RBS channel and, if this is the case, the type of RBS technique (LSB change to 0 or 1) being used. The identification logic assesses the arriving PCM data stream in this way in order to determine and to store the characteristic of the training signal.

Depending on the result of the evaluation by the identification logic 9, said logic 9 programs a control mask 10, which is supplied to a logic OR linking unit 11 downstream from the buffer 6. Other forms of logical linking, for example a logical AND link, are, of course, also feasible. As has already been mentioned above, the control mask 10 is used in particular to ensure that the bits which have been changed by the RBS technique are set to a constant value (preferably to 1) before they reach the Codec 4. If an RBS channel and the type of RBS technique have been identified, for each received PCM value buffer stored in the buffer 6, the control mask 10 can be programmed, for example, such that the LSB of the PCM value to be passed on to the Codec 4 is fixed at LSB=1.

Since, owing to attenuators, the LSB is not necessarily changed in every PCM value that is affected by the RBS technique, the check of the received PCM values in the training signal as described above should preferably be carried out during the entire training phase. The end of the training phase can be identified by the monitoring logic 8 by monitoring for the occurrence of a PCM value which indicates the end of the training phase.

The position and nature of the RBS channels are preferably still stored in the identification logic 9 after the end of the training phase, for further use of the modem connection.

A second exemplary embodiment of the present invention is described in the following text. According to this second exemplary embodiment as well, the training signal transmitted during the training phase is used to identify RBS channels or RBS values, with the second exemplary embodiment making use of the fact that—as has already been mentioned—a V.90 modem, for example, produces the training signal digitally in the form of twenty repeated digital PCM values. Owing to the length of the PCM data, the position of the PCM samples is shifted, on each repetition, by two positions with respect to the previous repetition, with respect to RBS channels. RBS channels can be deduced by comparing the mutually shifted PCM values. Furthermore, as an alternative in the second exemplary embodiment, a PCM value which has been changed by the RBS technique can also be replaced by the original PCM value, since this is known or can be determined.

The idea on which the second exemplary embodiment is based will be explained in more detail in the following text with reference to the illustrations in FIG. 3 and FIGS. 4A/4B.

FIG. 3 shows the layout of a training sequence or a training signal in accordance with the V.90 standard, in which, as can be seen, the training signal is composed of a repetition of a number of blocks of 160 bytes. The first and the last block in this training sequence may differ from the predetermined repetition, owing to transitional signals from the preceding signal.

As has already been explained, an RBS channel is characterized in that the LSB of the corresponding PCM value is changed. The LSB is preferably changed to "1". Alternatively, it can also be changed to "0", or the signaling stream can be transmitted in transparent form to the Codec 4 shown in FIG. 1. Accordingly, an RBS channel can be identified by comparing the LSB values of the PCM values transmitted repeatedly at an interval of 160 bytes. If the corresponding PCM values have different LSB values, one of these PCM values must correspond to an RBS channel. Three successive repetitions of one PCM value are preferably compared. That repetition whose LSB differs from the LSB values of the other two repetitions must correspond to an RBS channel.

However, the implementation of the principle of the second exemplary embodiment described above must take account of the fact, as already explained, that the position of the PCM values changes by two positions within each repetition, owing to the length of the transmitted PCM data.

As is shown in FIG. 4A, after identification of the start of the first repetition, which comprises 160 bytes, of the training signal, the first six PCM values are buffer stored in the form of a first data record, and are used for the subsequent comparison. The same PCM values occur once again after a further 160 bytes. A second data record is stored, but with this data record having the PCM values arranged such that they are shifted by two positions with respect to the first data record. A third data record is stored after another 160 bytes, and is once again shifted by two PCM values. The first data record thus comprises the PCM values Nos. 1–6, the second data record the PCM values Nos. 3–8, and the third data record the PCM values 5–10.

When comparing the PCM values in the individual data records, it is in consequence necessary to take account of their different positions in the corresponding data records. As is indicated by solid circles in FIG. 4B, the PCM value located at position No. 5 in the first data record must be compared with the PCM value located at position No. 3 in the second data record and with the PCM value located at position No. 1 in the third data record. In the same way, the PCM values located at the positions No. 6, No. 4 and No. 2 can be compared, as is indicated by dashed circles in FIG. 4B.

Figure 5:
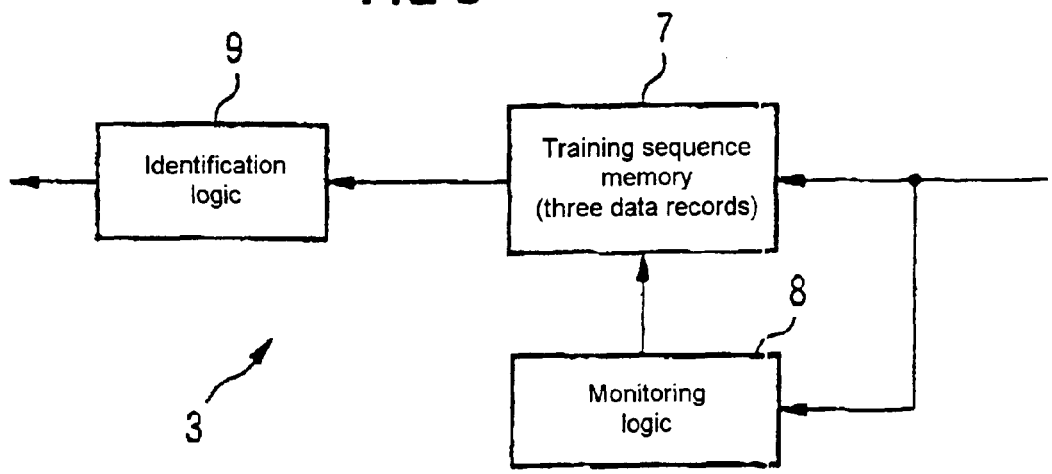
FIG. 5 shows a block diagram of a second exemplary embodiment of an apparatus according to the invention.

FIG. 5 shows the design of that section of the second exemplary embodiment of an RBS detector 3 which differs from FIG. 2, with the RBS detector 3 once again being connected in the form of a signal processor between the digital communications network 2 and the Codec 4 (see FIG. 1).

The monitoring logic shown in FIG. 5 monitors the received PCM data for the occurrence of the training phase. After identification of the training phase, the monitoring logic 8 monitors the PCM data for the occurrence of the repetitions described above. After identification of the repetitions, the respective three data records, as shown in FIG. 4A and shifted by two PCM values with respect to one another, are buffer stored in the training sequence memory 7. The identification logic 3 assesses the buffered stored data records and identifies the presence of an RBS channel if there are any differences between the LSB values of the corresponding positions in the three data records. The position of the RBS channel preferably remains stored in the decision logic 9 for further use of the modem connection. The decision logic 9 is also designed such that it also determines the nature of the RBS channel on the basis of the PCM values of the three data records which are compared with one another and different PCM values at a respective interval of six samples, whose original values have different LSB values, that is to say whether the LSB has been fixed at "0" or "1", or the signaling stream is transmitted to the Codec.

The rest of the design of the RBS detector 3 corresponds to the configuration shown in FIG. 2, that is to say, after identification of an RBS channel, the identification logic 9 can once again program a control mask 10 which is supplied, together with the received code word stored in the buffer store 6, to logical OR linking logic 11, which supplies the code word, corrected in this way, to the Codec 4 shown in FIG. 1.

Furthermore, the identification logic 9 can also determine the original PCM value of an identified RBS channel, and can transmit this value to the Codec 4 instead of the PCM value that has been changed by the RBS technique. This is possible in particular because the individual PCM values are transmitted repeatedly during the training phase (for example in the form of twenty repetitions), so that, for example on identifying an RBS channel on the basis of a comparison of the PCM values at the positions 5-3-1 in the three stored data records, the corresponding original PCM value can be determined on the basis of those positions in the three data records which are not occupied by an RBS channel, and can be used as a replacement for the RBS channel value.

In the exemplary embodiment explained above, the knowledge obtained during the identification process is once again stored so that it can also be taken into account later, after the end of the training phase, for corresponding correction of PCM values that have been subject to RBS. According to the second exemplary embodiment, a number of repetitions or data records, for example three, must be stored for identification of RBS channels. However, better and more reliable results can be achieved if a greater number of repetitions, in particular six repetitions, are stored, and the corresponding PCM values in the training signal are compared with one another.

What is claimed is:

1. A method for correcting digital code words in a digital communications network, with digital code words being transmitted via the digital communications network, and with a specific bit in a corresponding code word being changed for an RBS channel in the digital communications network, with training code words transmitted during a training phase being evaluated, in that the presence of an RBS channel is deduced as a function of the result of the evaluation of the training code words, and in that, after identifying an RBS channel, the code word corresponding to the identified RBS channel is corrected by setting the specific bit in this code word to a fixed value, wherein the training code words are transmitted repeatedly during the training phase, corresponding training code words which are transmitted during different repetitions via the digital communications network are compared with one another, and if any difference is found between the specific bits in the training code words compared in this way, the corresponding channel is identified as an RBS channel, a specific number of training code words are stored at regular intervals in the form of corresponding data records, and in that the corresponding training code words in the stored data records are compared with one another in order to identify an RBS channel, at least three data records are stored, and the respectively corresponding training code words in the individual data records are compared with one another, with that training code word whose specific bit differs from the specific bits in the other training code words compared in this way being identified as being associated with an RBS channel.

2. The method as claimed in claim 1, wherein each data record comprises 160 training code words.

3. The method as claimed in claim 1, wherein six data records are stored, and the respectively corresponding training code words in the individual data records are compared with one another.

4. The method as claimed in claim 1, wherein, after identification of an RBS channel, the code word corresponding to the identified RBS channel is corrected by setting the specific bit in this code word to a value "1", and outputting the corrected code word to a coding/decoding apparatus for further processing.

5. The method as claimed in claim 1, with the corresponding training code words in the individual stored data records occurring at positions which are shifted with respect to one another, the original values of the code words associated with the RBS channels are determined from the code words which are stored in the data records and are not associated with RBS channels, and in that the code words associated with an identified RBS channel are replaced by their original value found in this way, and are output to a coding/decoding apparatus for further processing.

6. The method as claimed in claim 1, wherein, after the identification of an RBS channel, its position is stored for correction of code words for this RBS channel received during normal operation.

7. An apparatus for correcting digital code words in a digital communications network, with digital code words being transmitted via the digital communications network, and with the digital communications network being designed such that a specific bit in a corresponding code word is changed for an RBS channel, with monitoring means being provided, which monitor the code words transmitted via the digital communications network for the start of a training phase, in that identification means are provided, which, once the monitoring means have identified the start of the training phase, evaluate training code words transmitted during the training phase in order to deduce the presence of an RBS channel as a function of the result of the evaluation of the training code words, and in that code word correction means are provided which, once the identification means have identified an RBS channel, correct the code word corresponding to the identified RBS channel by setting the specific bit in this code word to a fixed value, wherein the training code words are transmitted repeatedly during the training phase, memory means are provided in order to store a specific number of training code words at regular intervals in the form of corresponding data records, and in that the identification means are designed such that they compare corresponding training code words in the data records stored in the memory means with one another and, if any difference is found between the specific bits in the training code words compared in this way, identify the corresponding channel as an RBS channel, the memory means store at least three data records, and in that the identification means are designed such that they identify a training code word whose specific bit differs from that of the training code words compared with it as being associated with an RBS channel.

8. The apparatus as claimed in claim 7, wherein each data record comprises 160 training code words.

9. The apparatus as claimed in claim 7, wherein the memory means store six data records.

10. The apparatus as claimed in claim 7, wherein buffer storage means are provided for buffer storing the code words received from the digital communications network, and
   in that the code word correction means comprise logical linking means connected downstream from the buffer storage means,
   with the identification means being designed such that, after identifying an RBS channel as a function of the specific bit in the code word corresponding to the RBS channel, they produce a control word and pass this to the logical linking means,
   with the logical linking means receiving, as a further input signal, the code word which has been buffer stored in the buffer storage means, and carrying out a logical linking process between this and the control word of the identification means.

11. The apparatus as claimed in claim 10, wherein the logical linking means subject the code word which is buffer stored in the buffer storage means and the control word of the identification means to a logical OR linking process.

12. The apparatus as claimed in claim 10, wherein the identification means produce the control word in such a manner that each code word which is buffer stored in the buffer storage means and is identified as being associated with an RBS channel is output by the logical linking means with its specific bit set to the fixed value "1".

13. The apparatus as claimed in claim 7, with the corresponding training code words in the individual data records stored in the memory means occurring at positions which are shifted with respect to one another, characterized in that the identification means are designed such that they determine the original value of a code word associated with an RBS channel using those code words which are stored in the data records in the memory means but are not associated with RBS channels, and output this value instead of the received code word which is associated with the RBS channel.

14. The apparatus as claimed in claim 7, wherein, after identifying an RBS channel, the identification means store its position for correction of code words for this RBS channel received during normal operation.

* * * * *